United States Patent

Go et al.

[11] Patent Number: 6,011,612
[45] Date of Patent: *Jan. 4, 2000

[54] PROCESSING APPARATUS USING A LASER LIGHT SOURCE

[75] Inventors: Masato Go, Yokohama; Tsunesaburo Uemura, Tokyo, both of Japan

[73] Assignee: Nikon Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/925,734

[22] Filed: Sep. 9, 1997

Related U.S. Application Data

[63] Continuation of application No. 08/429,511, Apr. 26, 1995, abandoned, which is a continuation of application No. 08/274,368, Jul. 13, 1994, abandoned, which is a continuation of application No. 08/083,461, Jun. 30, 1993, abandoned.

[30] Foreign Application Priority Data

Jul. 3, 1992 [JP] Japan ..................................... 4-176878

[51] Int. Cl.$^7$ .............................. G03B 27/42; G01D 9/42
[52] U.S. Cl. .................................. 355/69; 355/53; 355/67; 250/341.4; 250/230.2; 250/259.12
[58] Field of Search ................................... 355/53, 67, 69, 355/71; 250/341.4, 345, 203.2, 559.12, 559.13, 559.24, 231.18

[56] References Cited

U.S. PATENT DOCUMENTS

| | | | |
|---|---|---|---|
| 4,325,083 | 4/1982 | Rouchon et al. | 358/225 |
| 4,804,978 | 2/1989 | Tracy | 346/108 |
| 4,970,546 | 11/1990 | Suzuki et al. | 355/53 |
| 4,994,677 | 2/1991 | Graindorge | 250/560 |
| 5,097,291 | 3/1992 | Suzuki | 355/69 |
| 5,191,374 | 3/1993 | Hazama et al. | 355/43 |

*Primary Examiner*—Daniel P. Malley
*Attorney, Agent, or Firm*—Shapiro and Shapiro

[57] ABSTRACT

A processing apparatus having a laser light source for oscillating a pulse in response to a predetermined trigger signal and irradiating the beam emitted from the laser light source to an object to process the object comprises a position detection unit for detecting a position of a dimmer removably mounted in a light path of the emitted beam, and trigger control means for generating a trigger pulse train for causing the pulse oscillation type laser light source to emit light and sending out the light emission trigger pulse train to the laser light source when the position of the dimmer is within a predetermined allowable range around a predetermined target set position.

23 Claims, 6 Drawing Sheets

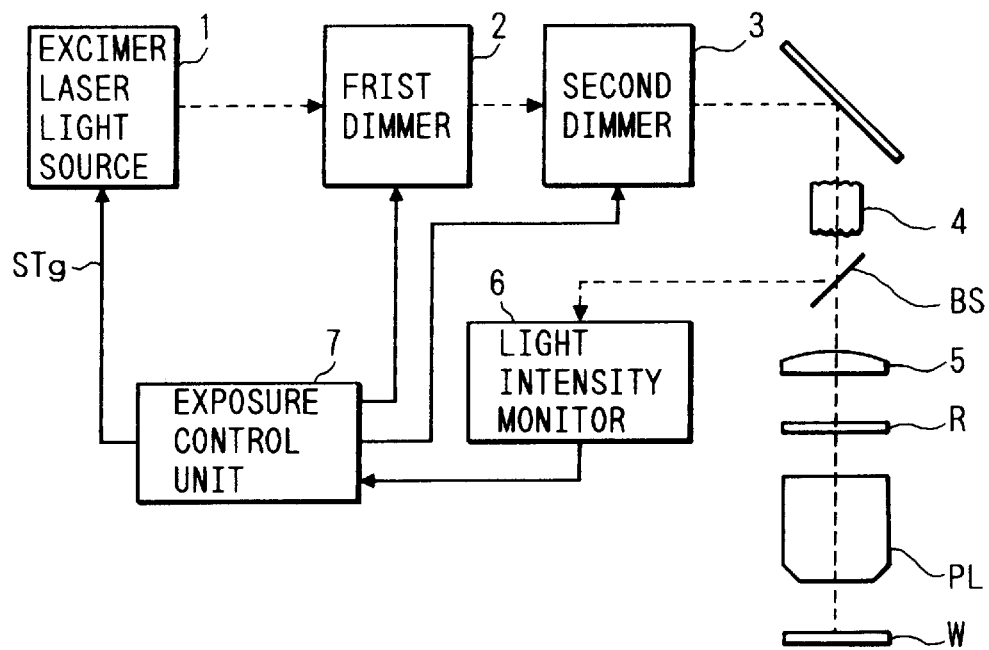
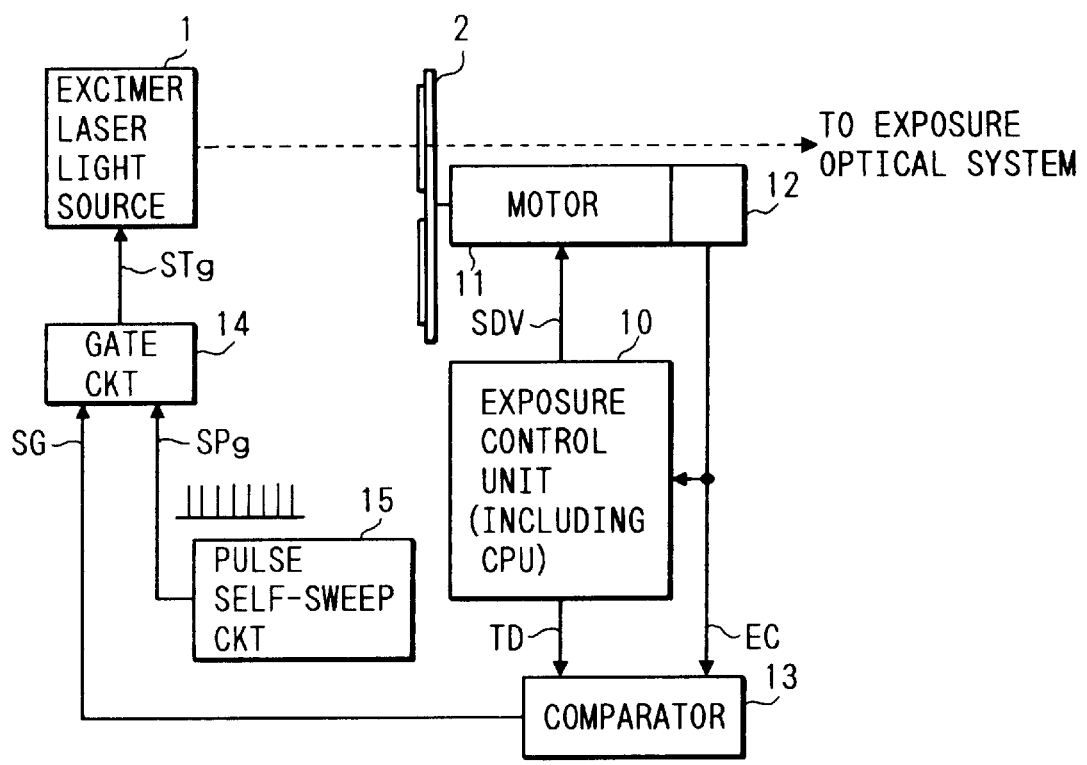

PROCESSING APPARATUS USING A LASER LIGHT SOURCE

This is a continuation of application Ser. No. 08/429,511 filed Apr. 26, 1995, which is a continuation of application Ser. No. 08/274,368 filed Jul. 13, 1994, which is a continuation of application Ser. No. 08/083,461 filed Jun. 30, 1993, all now abandoned.

BACKGROUND OF THE INVENTION

1. Field of the Invention

The present invention relates to an exposure apparatus having a laser light source or a working apparatus such as a repairing apparatus for a wafer or a mask by using a laser beam, and more particularly to an exposure apparatus for exposing a pattern formed on a mask to a photo-sensitive substrate such as a semiconductor wafer through a projection optical system in a lithography process in the manufacture of a semiconductor integrated circuit.

2. Related Background Art

In the lithography process in the manufacture of the semiconductor integrated circuit, an exposure apparatus (stepper) for exposing a pattern formed on a mask to a member to be exposed (resist) applied on a surface of a semiconductor wafer through a projection optical system has been known.

Recently, as the integration density of the semiconductor integrated circuit increases, a minimum pattern of the circuit tends to be further reduced. As a result, a control precision of an exposure amount for the stepper requires the reproducibility of in the order of ±1%.

An exposure light source which uses an excimer laser which can attain a higher resolution power instead of a mercury lamp which was heretofore widely used has been developed.

Usually, a pulse light source such as an excimer laser has an energy amount which varies every pulse. In this case, the pulse energy varies from several % to ten plus several % with respect to its target value. Thus, the control method for achieving the desired exposure control precision described above includes the methods (a) and (b) described below.

(a) A pulse count control system (U.S. Pat. No. 5,097,291) in which the pulse energy of the laser is reduced or the exposure energy is reduced by a dimmer provided in the exposure apparatus and the exposure is made with a larger number of pulses to reduce an effect of the energy variation per pulse for the accumulated energy.

(b) A correction exposure system in which a coarse exposure which provides a slightly lower exposure than a target exposure is given and a remaining required exposure is given by a correction exposure by one or plurality of pulses having the exposure energy thereof lowered by a dimmer (light intensity attenuation filter) provided in the exposure apparatus.

In addition, a high voltage control system in which the pulse energy is adjusted by varying a high voltage of a laser every one or several pulses has been known. However, the above methods (a) and (b) are widely used because of the ease of the control system.

When the prior art exposure system is used, the following problems are encountered.

In the method (a) above, the number of exposure pulses is larger than that of the method (b). As a result, the time of exchange of the consuming parts such as the electrode material and the electrode element in the laser light source per wafer exposure is short and the maintenance period is shortened and a downtime of the apparatus increases. Further, the number of times of exchange of gas in the laser light source increases and the running expense increases.

On the other hand, in the method (b), the laser light emission is temporarily stopped after the completion of the coarse exposure during the exposure of one chip, and the dimmer is activated and then the laser light emission is resumed to conduct the correction exposure. Accordingly, the throughput is lower than that of the method (a) unless the positioning time of the dimmer is sufficiently short.

For example, in order to prevent the throughput from being reduced when 60 exposure pulses required in the method (a) is reduced to 25 pulses in the method (b), the time relation of the exposure process of one chip is represented as follows.

$$60/500 \geq 25/500 + t$$

where 500: laser oscillation frequency (approximately 500 Hz for a currently widely used laser)

t: activation setting time of the dimmer

From the above relation, the setting time t of the dimmer is given by $t \leq 70$ msec. Thus, the high speed activation of 70 msec or less is required for the activation time of the dimmer and this poses a mechanical and control restriction.

The light emission frequency of the laser will tend to become higher in the future and the restriction will become more severe. For example, the dimmer may be continuously rotated by a motor to be moved into and out of a light path of a laser beam and the laser beam may be emitted when the dimmer coincides with the laser light path. In this method, however, it is difficult to activate the laser at a maximum frequency in order to absorb variation in the rotation speed and the motor failure causes the increase of the downtime of the exposure apparatus.

In both the methods (a) and (b), the dimmer may be switched before the start of the exposure in order to attain the minimum number of exposure pulses to meet the exposure control precision depending on the target exposure, and such activation time is added to the exposure processing time.

SUMMARY OF THE INVENTION

It is an object of the present invention to provide a high throughput and low running cost exposure apparatus using the prior art method, particularly the method (b) without imposing a large restriction to an activation mechanism of the dimmer.

In the present invention, position detection means for detecting a moving position of a removable dimmer is provided in a light path of a laser beam, and trigger control means for generating a trigger pulse train for activating a pulse oscillation type laser light source and sending the activation trigger pulse train to the light source in a predetermined allowable range around a predetermined target set position of the dimmer is provided.

In accordance with the present invention, the activation trigger pulse train is immediately sent if the laser beam is at a position not blocked by the dimmer. Thus, the light source can be activated during the activation of the dimmer, that is without waiting for the complete stop at the target position, and the light emission processing time can be shortened.

BRIEF DESCRIPTION OF THE DRAWINGS

FIG. 1 shows an overall configuration of an exposure apparatus to which the present invention is applied;

FIG. 3 shows a block diagram of a control system for controlling the dimmer shown in FIG. 2;

DETAILED DESCRIPTION OF THE PREFERRED EMBODIMENTS

Figure 2A:
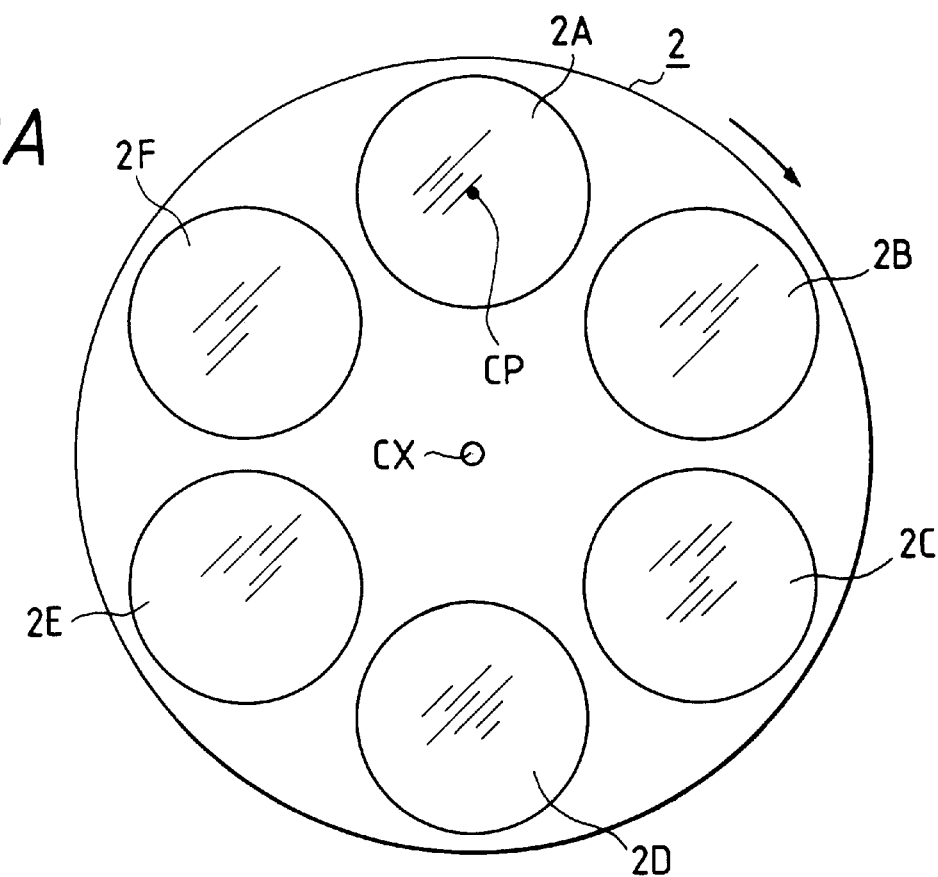
FIGS. 2A and 2B show a construction of a dimmer and an allowable setting range.

One embodiment of the present invention applied to an exposure apparatus (stepper or aligner) is now explained with reference to FIGS. 1–3.

In FIG. 1, a laser beam from a pulse oscillation type excimer laser light source 1 is directed to an exposure illumination optical system through a first dimmer (attenuator) 2 and a second dimmer 3. In the illumination optical system of FIG. 1, only an optical integrator (fly eye lens) 4 and a condenser lens 5 are shown as representative ones. The pulse beam from the condenser lens 5 illuminates a reticle R with a uniform illumination distribution, and a pattern of the reticle R is projected to a wafer W through a projection lens PL.

A light intensity monitor 6 senses a portion of a pulse beam reflected by a beam splitter BS (having a large transmissivity and a small reflection factor) obliquely arranged behind the optical integrator 4, and accumulates the energy thereof for each pulse to monitor the one shot exposure. The result is sent to an exposure control unit 7 so that it is used to control the output of a trigger pulse signal $ST_g$ to the excimer light source. The exposure control unit 7 further controls the attenuation factors of the first dimmer 2 and the second dimmer 3.

The first dimmer 2 changes the attenuation factor (transmissivity) stepwise at a relatively coarse step, and the second dimmer 3 is used to finely adjust the energy of the input beam. For example, the attenuation factor of the second dimmer is set between several % and ten plus several %, and the attenuation factor may change either stepwise or continuously.

FIG. 2A shows a construction of the first dimmer 2. In the present embodiment, six disk-shaped dimmer (ND) filters 2A, 2B, 2C, 2D, 2E and 2F having different attenuation factors are arranged on a circumference of a turret plate at a uniform angular interval. In FIG. 2A, CX denotes a rotation shaft of the turret plate and CP denotes a center point of each of the dimmer filters 2A to 2F. The second dimmer 3 may be of the same construction as that of FIG. 2A. Of the six dimmer filters 2A to 2F shown in FIG. 2A, one of them is inserted into the light path of the laser beam in response to a command from the exposure control unit 7.

Figure 2B:
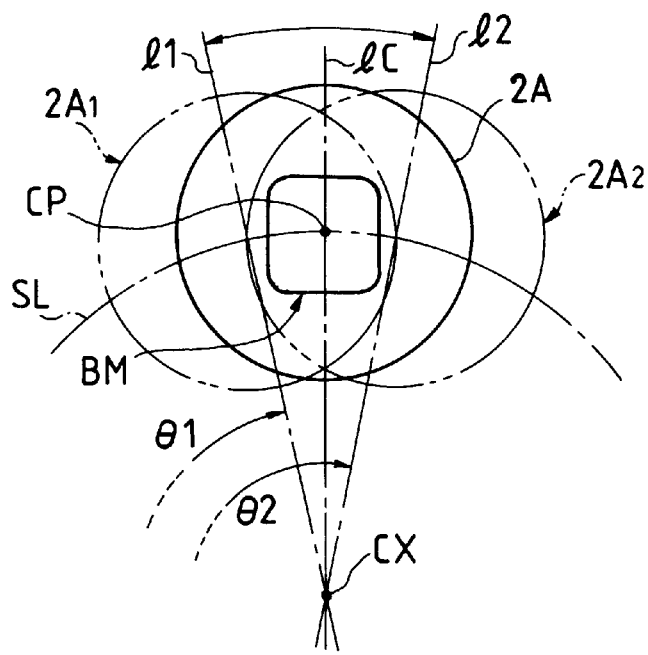

FIG. 2B shows a relation of arrangement of the dimmer filter 2A (same for the other filters 2B to 2F) and the laser beam BM. A circle SL centered on the rotation axis CX represents a locus of movement of the center point CP of the filter 2A, and a line $l_c$ extending through the axis CX represents a target set position during the rotation of the turret plate. Namely, the turret plate is rotated such that the center point CP of the filter 2A coincides with the line $l_c$.

A section of the beam from the excimer laser light source 1 is rectangular and the center of the beam BM coincides with the center point CP of the filter 2A when the filter 2A is settled at the target position (on the line $l_c$).

However, the sectional area of the beam BM is smaller than the effective area of the filter 2A. As a result, as shown in FIG. 2B, when the center point CP of the filter 2A is on the line $l_1$ or the line $l_2$ passing through the axis CX (2$A_1$ and 2$A_2$) the beam BM passes through without being blocked by the filter 2A (while the beam BM is completely comprehended in the filter 2A). Namely, when the rotating angle position of the turret plate is between $\theta_1$ to $\theta_2$ in FIG. 2B, the beam BM can pass through at the attenuation factor determined by the filter 2A even if the turret plate is not yet settled at the target position.

In the present embodiment, when the center point CP of the filter 2A (same for the filters 2B to 2F) is settled on the line $l_c$, it is taken as the target set position of the first dimmer 2 and the angle range ($\theta_2-\theta_1$) defined by the two lines $l_1$ and $l_2$ on the both sides of the line $l_c$ is taken as the allowable set range.

The first dimmer and the second dimmer may be selectively used for the coarse exposure and the correction exposure described in the method (b).

The functions of the respective dimmers in such a case are briefly explained below.

The first dimmer 2 is used as the coarse exposure dimmer filter which is switched prior to the exposure in order to dim the incident light to such an energy that the target exposure is reached by a predetermined number of pulses, based on the intensity of the output beam from the laser light source 1 applied to the exposure apparatus and the proper exposure to make sensitive a member to be exposed. When the attenuation factor is a discrete value, a filter which produces a smaller pulse energy is selected.

On the other hand, the second dimmer 3 is used as the correction exposure dimmer filter to switch for dimming the pulse energy in order to complete the remaining required exposure by one or a plurality of pulses after the completion of the coarse exposure (at which the exposure level is such that the target exposure is exceeded by one pulse energy of the coarse exposure).

In FIG. 2B, the beam sectional shape on each filter is shown substantially as a square but the beam sectional shape at the position of an oscillation source in a usual excimer laser light source is rectangular. Thus, when the filter is to be exchanged at a point where the beam sectional shape is rectangular, the longitudinal side of the rectangle is to be rendered to coincide with the radial direction of the turret plate. Thus, when the diameter of each filter is equal to that of FIG. 2B, the allowable setting range of the angle ($\theta_2-\theta_1$) is larger than that of FIG. 2B and the apparatus may be operable even if the hunting of the drive mechanism of the turret plate is large.

When the beam is continuously irradiated to one point on the filter, the filter characteristic may be deteriorated at that point. Accordingly, for each exchange of the filter, the settling position of the filter may be shifted slightly in accordance with the frequency of use of the filter.

FIG. 3 shows a block diagram of a system for the activation control of the dimmer and the exposure control used in the exposure apparatus of the present embodiment. The rotation of the first dimmer 2 is controlled by a motor 11 and the angular position thereof is detected by a rotary encoder 12. The motor 11 is driven in response to a drive signal SDV from an exposure control unit (including a CPU)

10, which receives a detection signal EC from the encoder 12 as feedback information and servo-controls the motor 11 so that the turret plate of the dimmer 2 is rotated to the target set position. When the motor 11 is a stepping motor, the drive signal SDV is a pulse signal and a number of pulses required to rotate it to the target set position are applied to the motor 11. Thus, the servo (feedback) control by the detection signal EC from the encoder 12 is not absolutely necessary.

The exposure control unit 10 applies data TD corresponding to the allowable setting range (between angles $\theta_1$–$\theta_2$ in FIG. 2B) to one input of a comparator 13 (second detector) and applies the detection signal EC from the encoder 12 to the other input. The comparator 13 has a counter for counting the detection signal EC (normally up/down pulses). The comparator 13 compares the count of the counter (which is reset every 360 degrees) with the data TD and enables the output signal (for example, a logical H) while the count is within the allowable range. The output signal SG is applied to one input of a gate circuit 14 and a pulse signal SPg from a pulse self-sweep circuit 15 is applied to the other input. The pulse self-sweep circuit 15 continuously oscillates at a frequency at which the excimer laser light source 1 can stably and repeatedly emit light (for example, 500 Hz). The gate circuit 14 outputs the pulse signal SPg as the trigger pulse STg for activating the excimer laser light source 1 only when the output signal SG is enabled.

An operation of the control system of FIG. 3 is now explained with reference to FIG. 4. (B) in FIG. 4 shows a time characteristic of the rotating angular position of the dimmer 2 (turret plate) detected by the rotary encoder 12 and shows the manner of convergence of the dimmer 2 to the target angular position. The dimmer 2 enters into the lower limit $\theta_1$ of the allowable range at a time Tin1, goes out of the upper limit $\theta_2$ of the allowable range at a time Tout1, again enters into the allowable range from the upper limit $\theta_2$ at a time Tin2 and then it is 2 settled. The output signal SG of the comparator 13 is enabled between the time Tin1 and the time Tout1, disabled between the time Tout1 and the time Tin2, and again enabled from the time Tin2 as shown in (C) in FIG. 4.

The gate circuit 14 logically ANDs the output signal SG of (C) in FIG. 4 and the pulse signal SPg of (D) in FIG. 4 to output the trigger pulse signal STg shown in (E) in FIG. 4. On the other hand, the manner of the generation of the trigger pulse in the prior art system is shown in (A) in FIG. 4 for comparison purpose. In the prior art, it is assumed that the dimmer 2 is settled if it does not deviate from the allowable range for a predetermined waiting time (set beforehand from the moment at which the dimmer 2 enters into the allowable range ($\theta_1$–$\theta_2$) around the target angular position, and the light emission trigger is started at that moment. As seen from the comparison of (A) and (E) in FIG. 4, the system of the present embodiment improves the throughput as compared with that of the prior art system.

In this manner, it is possible to activate the excimer laser before the dimmer (filter) is completely settled to the target position after it has been activated so that the exposure processing time per shot can be shortened.

Looking carefully at (A) and (D) in FIG. 4, it may happen that there is a time lag of approximately one period of the pulse signal SPg, at maximum, between the time $T_1$ of the occurrence of the first pulse signal SPg outputted immediately after the output signal SG has been enabled at the time Tin1 and the time Tin1. This may also happen between the time Tin2 and the time $T_1'$ of the occurrence of the pulse signal SPg immediately after the time Tin2.

Figure 3A:
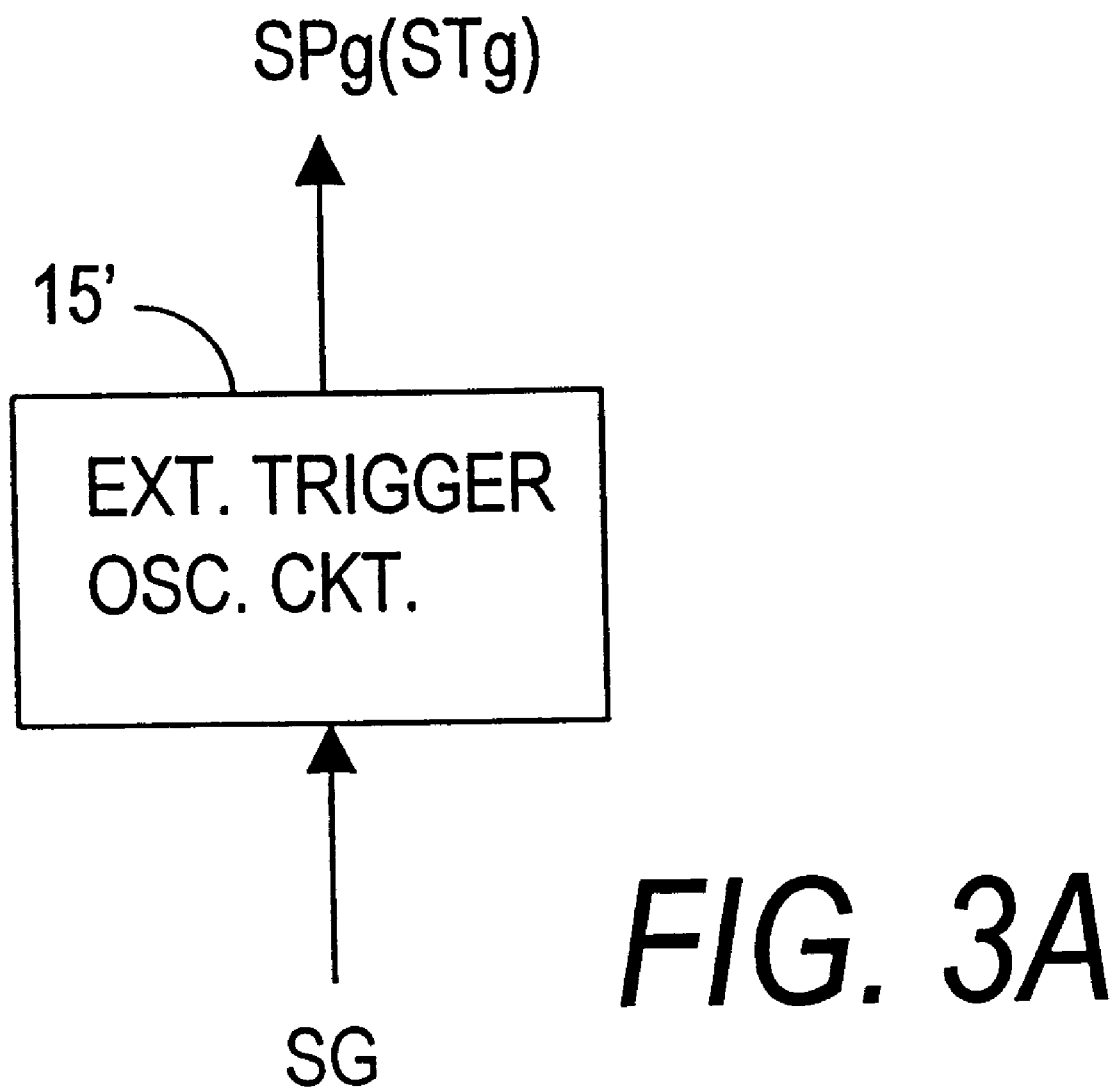
FIG. 3A shows a modification.
Figure 4:
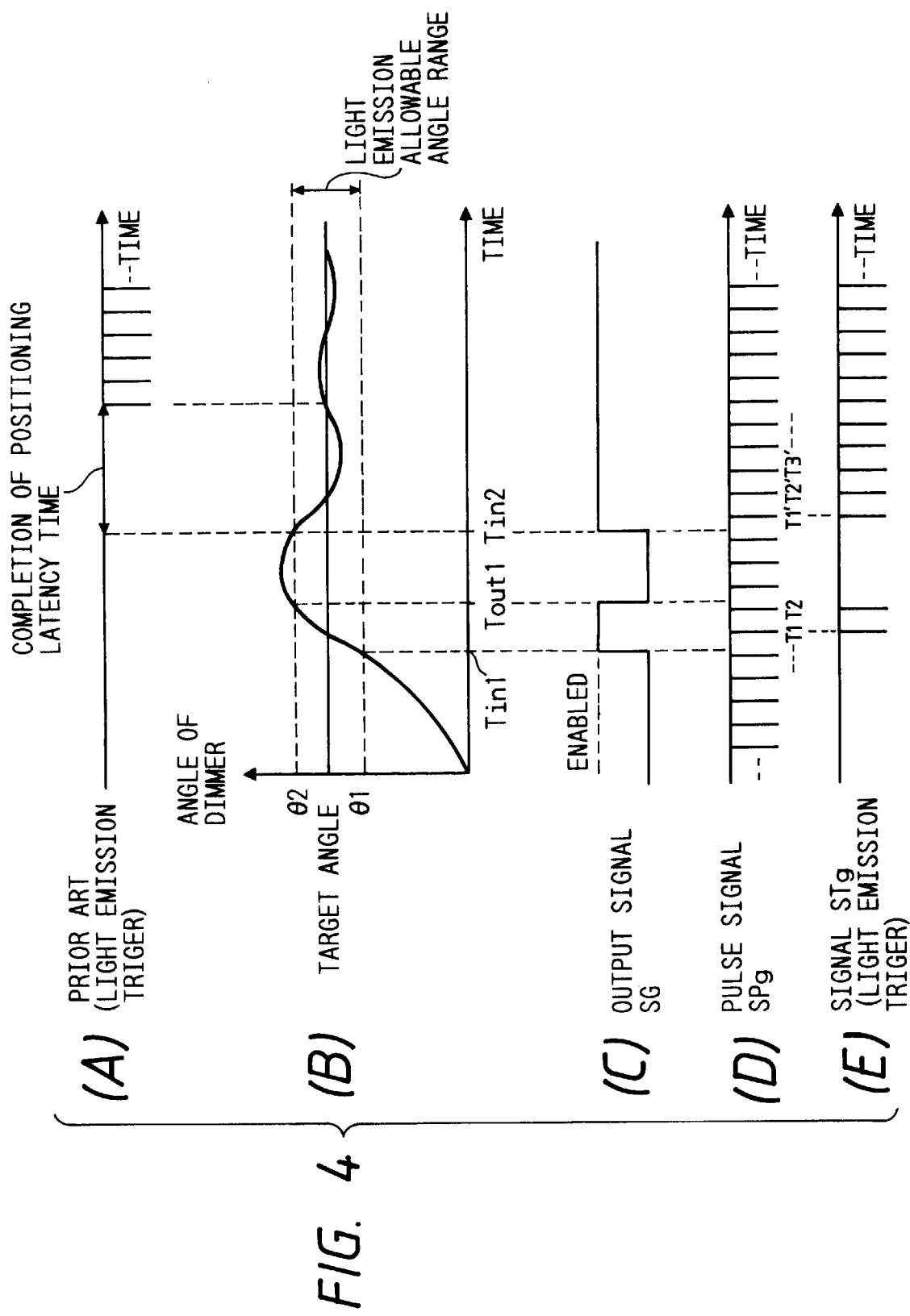
FIG. 4 shows a timing chart of an operation of the control system of FIG. 3.

Thus, in a modification of the control system of FIG. 3, shown in FIG. 3A, the pulse self-sweep circuit 15 is changed to an externally triggered oscillation circuit 15' and the output signal SG from the comparator 13 is used as the external trigger so that the trigger pulse signal STg is generated at a fixed frequency (for example, 500 Hz) at the moment that the output signal SG is enabled. The externally triggered oscillation circuit stops the oscillation when the output signal SG is switched from the enable state to the disable state.

Figure 5:
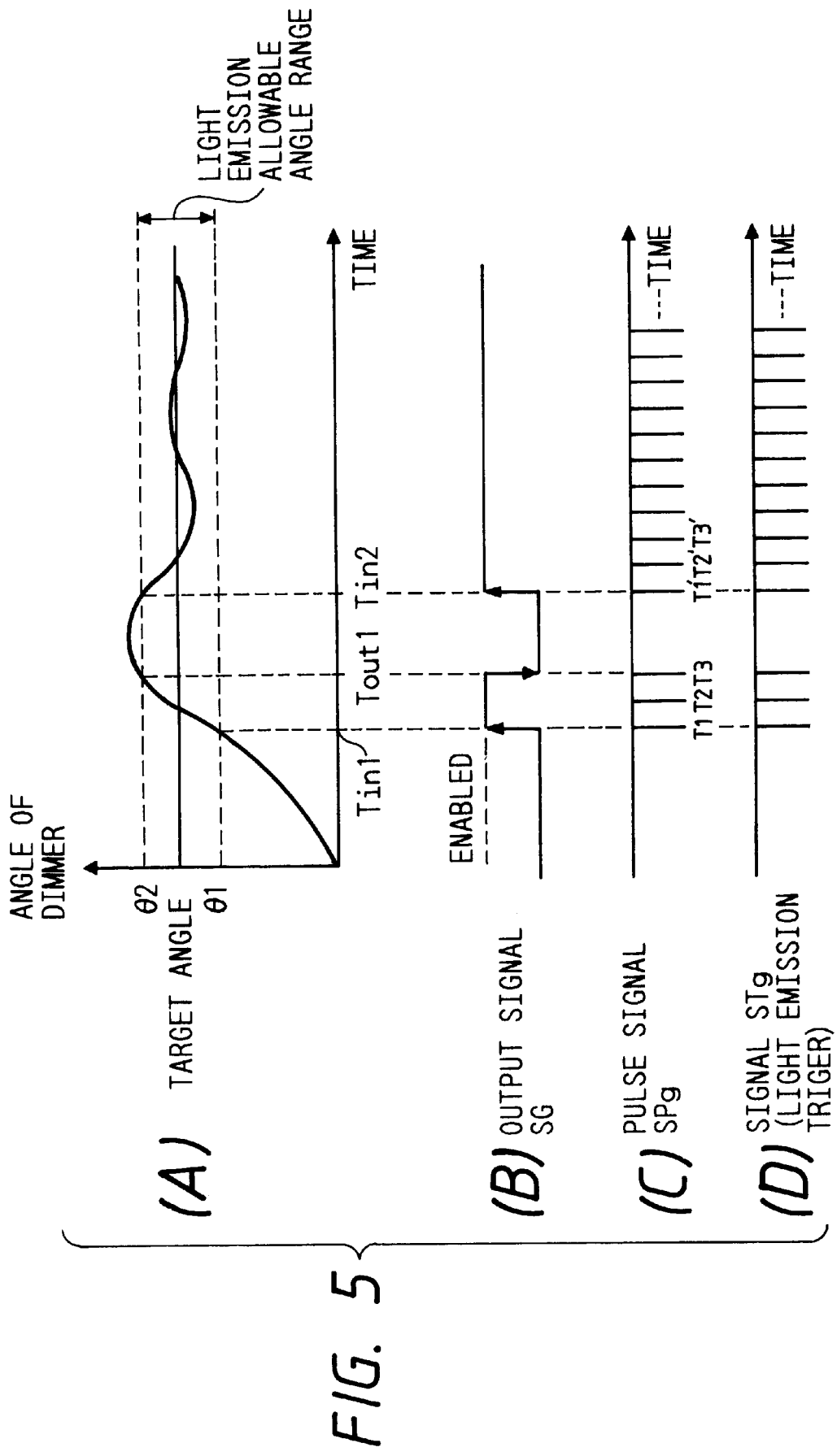
FIG. 5 shows a timing chart of an operation of a modification of the control system of FIG. 3.

An operation in such a construction is briefly explained with reference to FIG. 5. (A) in FIG. 5 is the same as (B) in FIG. 4. As shown in (B) in FIG. 5, the pulse oscillation circuit 15' is triggered at a rising edge of the output signal SG to generate the pulse signal SPg as shown in (C) in FIG. 5, and the oscillation of the pulse oscillation circuit 15' is stopped at a falling edge of the output signal SG. Accordingly, the pulse signal SPg from the pulse oscillation circuit 15' is directly generated as the trigger pulse signal STg for the excimer laser light source 1 as shown in (D) in FIG. 5.

In this manner, by the provision of the oscillation circuit which starts the oscillation by the enable state of the output signal SG of the comparator 13, the time lag shown in FIG. 4 is substantially eliminated and the exposure processing time is further reduced.

Besides the above modification, another example of the control operation shown in FIG. 4 is now described. In FIG. 4, if a time ($T_1'$–$T_2$) from the time $T_2$ of the internal pulse SPg lastly sent out while the previous output signal SG is enabled after the dimmer moved off the allowable range at the time Tout1 and the send-out of the trigger pulse STg was stopped and the dimmer again entered into the allowable range at the time Tin2 to the time $T_1'$ of the internal pulse SPg first sent out after the time Tin2 is shorter than a minimum period ($\Delta t$) required for the laser light source to stably and repeatedly emit light, then the trigger pulse STg is not sent out at the time $T_1'$ and after the period $\Delta t$ from the time $T_1'$, the subsequent internal pulses (at times $T_2'$, $T_3'$, . . . ) are sent out. In this manner, the oscillation of the excimer laser light source 1 is stabilized and so-called miss-trigger is prevented.

This should also be considered in the control system shown in FIG. 5. Namely, if a time ($T_1'$–$T_3$) between the pulse sent out at the time $T_3$ and the pulse sent out at the time $T_1'$, out of the pulse signal SPg shown in (C) in FIG. 5 is shorter than the minimum period $\Delta t$, it is necessary to provide a limit circuit to maintain the minimum period $\Delta t$.

Figure 6:
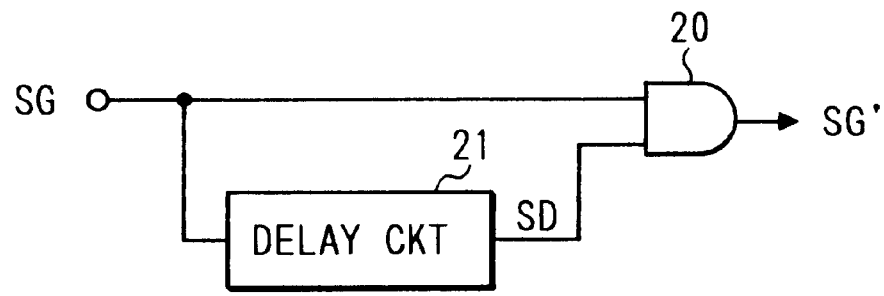
FIG. 6 show a circuit for controlling a time interval of laser light emission to longer than a predetermined time.

FIG. 6 shows an example of such a limit circuit. The output signal SG from the comparator 13 is applied to one input of a two-input AND circuit 20, and an output signal SD of a delay circuit 21 which is triggered by the falling edge of the signal SG is applied to the other input of the AND circuit 20. The output signal SD of the delay circuit 21 is normally enabled (logical H) but when the falling edge of the signal SG is received, it is disabled (logical L) for the minimum period $\Delta t$ required for the pulse oscillation of the laser or for a predetermined time longer than $\Delta t$.

Figure 7:
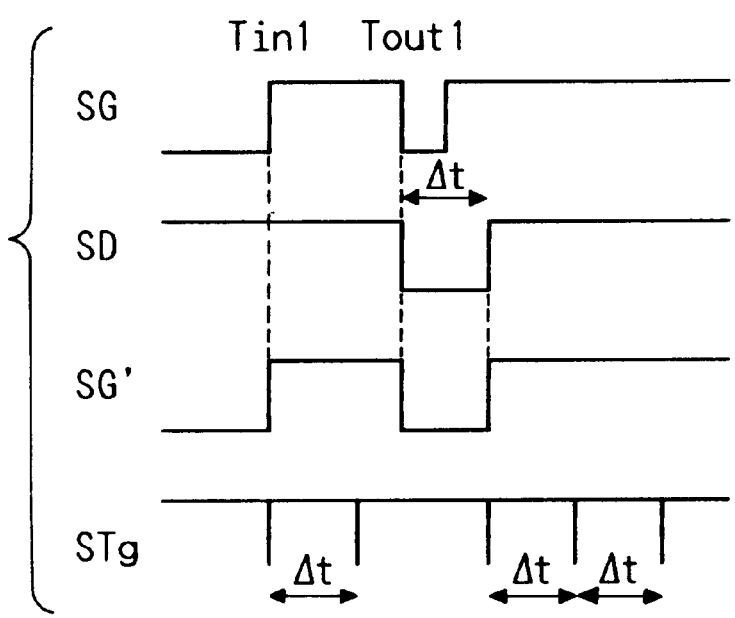
FIG. 7 shows a timing chart of an operation of the circuit of FIG. 6.

Thus, as shown in FIG. 7, the output signal SG' of the AND circuit 20 is enabled after a disable period of at least $\Delta t$ from the falling edge of the signal SG. As a result, even if the disable period after the time Tout1 of the initial output signal SG is shorter than $\Delta t$ as shown in FIG. 7, the pulse train of the final trigger pulse signal STg is maintained (limited) at least the minimum period $\Delta t$ everywhere.

The preferred embodiments of the present invention have been described. The present invention is applicable to any processing apparatus which controls the intensity of the pulse oscillation type laser beam by using the dimmer which is mechanically moved and driven. It may also be applied to the control of the pulsed energy other than the laser beam.

In the embodiments of the present invention, any one of the dimmer filters is inserted into the light path of the beam by rotating the turret plate to control the intensity. Alternatively, a number of filters may be selectively used by a linear slide system, or the angle of the beam splitter (or a half-mirror) to the incident beam may be varied to continuously or stepwise vary the ratio of the transmission factor and the reflection factor and the transmitted light or the reflected light may be utilized.

What is claimed is:

1. An illumination apparatus which radiates a beam emitted from a pulsed light source to an object, comprising:

an attenuator which is removably insertable in a light path of the light beam for attenuating the light beam;

a position detector to detect a position of the attenuator; and a controller, connected to said position detector and said pulsed light source, which sends out a trigger signal to the pulsed light source only when a position detected by said position detector is within a predetermined allowable range for said attenuator, in such a manner that before the attenuator reaches a settled state in the light path of the light beam, the light beam is radiated through the attenuator to the object.

2. An illumination apparatus according to claim 1, further comprising a projection optical system which projects onto a sensitive substrate an image of a pattern on the object and wherein the pulsed light source emits excimer laser light to which the sensitive substrate is exposed.

3. An illumination apparatus according to claim 2, further comprising:

a device which adjusts an intensity of the light beam independent of said attenuator; and an exposure control system which controls a dose of exposure with respect to the sensitive substrate by the use of said attenuator together with the adjusting device.

4. An apparatus in which a sensitive substrate is exposed by an image of a pattern on a mask, comprising:

a pulsed light source;

a movable member which holds a plurality of attenuators for selective insertion into an optical path of a light beam from the pulsed light source, said plurality of attenuators having different attenuating rates from each other for attenuating the light beam from the pulsed light source;

a position detector which detects a position of a selected one of said attenuators; and a controller, connected to said position detector and said pulsed light source, which sends out a trigger signal to the pulsed light source only when the detected position of the selected attenuator is within a predetermined allowable range, in such a manner that before the selected attenuator reaches a settled state in the optical path of the light beam in response to an actuation of the movable member, the light beam is radiated through the selected attenuator onto the mask.

5. An apparatus according to claim 4, further comprising:

a device to adjust an intensity of the light beam, independent of the attenuators, for controlling a dose of exposure with respect to the sensitive substrate.

6. An illumination apparatus which radiates a beam emitted from a pulsed light source to an object, comprising:

an attenuator which is removably insertable in an optical path of the light beam for attenuating the light beam, and which has a larger area than a sectional area of the light beam;

a first detector to detect a moving position of the attenuator when the attenuator is inserted into the optical path of the light beam;

a second detector to produce an output as a detection signal only when the sectional area of the light beam is substantially comprehended in the area of the attenuator in accordance with the moving position detected by the first detector; and a controller, connected to said second detector and said pulsed light source, which sends out a trigger signal to the pulsed light source in response to the detection signal, in such a manner that before the attenuator reaches a settled state in the optical path of the light beam, the light beam is radiated onto the object through the attenuator.

7. An illumination apparatus according to claim 6, wherein said controller includes a pulse generating circuit for self-sweep oscillating the trigger signal at a frequency repeatedly oscillatable by the pulsed light source, and a gate circuit for applying the trigger signal continuously outputted from the pulse generating circuit to the pulsed light source in response to the detection signal from the second detector.

8. An illumination apparatus according to claim 6, wherein the controller has an externally excited oscillation circuit for oscillating a pulse train at a substantially fixed frequency when said detection signal is applied and stopping the oscillation when the detection signal disappears, and applies the pulse train from said oscillation circuit to the pulsed light source as the trigger signal.

9. An illumination apparatus according to claim 7, further comprising an exposure system having a projection optical system for projecting on a sensitive substrate an image of a pattern on the object for exposing the sensitive substrate by an image of the pattern.

10. An apparatus according to claim 4, further comprising an exposure control system by which while the sensitive substrate is exposed by an image of the pattern, an intensity of the light beam is weakened so that a proper dose of exposure is provided to the sensitive substrate.

11. An illumination apparatus which radiates a light beam emitted from a pulsed light source to an object, comprising:

an attenuator device including an attenuator element removably insertable in a light path of the light beam for attenuating the light beam;

a position detector to detect a position of said attenuator element; and a control section, connected to said position detector and said pulsed light source, which detects, based on an output of said position detector, when said attenuator element enters a predetermined allowable range of positions in which said attenuator element substantially covers the light beam, and which outputs a trigger signal to said pulsed light source in response to the detection.

12. An apparatus according to claim 11, further comprising a projection optical system for projecting an image of a pattern of said object onto a photosensitive substrate, said pulsed light source emitting excimer laser light for exposing said photosensitive substrate.

13. An apparatus according to claim 11, further comprising a device, which is different from said attenuator device, for adjusting strength of said light beam, and an exposure control system for controlling a dose of exposure to said photosensitive substrate by using both said attenuator device and said adjusting device.

14. An apparatus according to claim 11, wherein said attenuator device comprises a plurality of attenuator elements having different attenuation rates and disposed within a common plane, said attenuator elements being selectively insertable into the light path of said light beam, and wherein said position detector detects respective positions of said plural attenuator elements.

15. An illumination apparatus which radiates a light beam emitted from a pulsed light source to an object, comprising;
    a plurality of attenuator elements for selective insertion into an optical path of the light beam for attenuating the light beam, said attenuator elements having different attenuation rates;
    a plate on which said plurality of attenuators are circumferentially disposed;
    an actuator to rotate said plate to place a selected one of said plurality of attenuator elements in the light path of said light beam;
    a detector to detect an angular position of said plate which is rotated by said actuator; and
    a control section, connected to said detector and said pulsed light source, which detects, based on the angular position of said plate detected by said detector, when the selected attenuator element enters a predetermined allowable range of positions in which that element substantially covers the light beam, and which outputs a trigger signal to said pulsed light source in response to the detection.

16. An apparatus according to claim 15, wherein said control section continues to send out the trigger signal to said pulsed light source while the selected attenuator element is in said predetermined range of positions, and terminates outputting of the trigger signal when the selected attenuator element exits said predetermined range of positions.

17. An apparatus according to claim 15, wherein said attenuator elements are disposed at substantially equal circumferential intervals.

18. An illumination apparatus which radiates a light beam emitted from a pulsed light source to an object, comprising;
    an attenuator to attenuate the light beam, an area of said attenuator being larger than a sectional area of the light beam;
    an actuator to rotate said attenuator to insert said attenuator in a path of said light beam;
    a first detector to detect a position of said attenuator;
    a second detector to detect, based on an output of said first detector, when said attenuator enters a predetermined allowable range of positions in which the area of said attenuator substantially covers the sectional area of said light beam; and
    a controller, connected to said second detector and said pulsed light source, to output a trigger signal to said pulsed light source in response to the detection by said second detector.

19. An apparatus according to claim 18, wherein said controller outputs the trigger signal to said pulsed light source in synchronism with a pulsed signal having a predetermined frequency.

20. An illumination apparatus which radiates an energy beam from a radiation source to an object, comprising:
    an attenuator removably insertable in a path of said energy beam for attenuating the energy beam;
    a position detector to detect a position of said attenuator; and
    a control section which detects, based on an output of said position detector, when said attenuator enters a predetermined allowable range of positions in which said attenuator substantially covers said energy beam, and which enables radiation of said energy beam to the object in response to the detection.

21. A method for irradiating an object with a light beam emitted from a pulsed light source, comprising the steps of:
    driving an attenuator for attenuating the light beam into a path of the light beam;
    determining whether the attenuator has entered an allowable range of positions in which the attenuator substantially covers a sectional area of the light beam; and
    oscillating the pulsed light source in response to a determination that the attenuator has entered the predetermined range.

22. A method according to claim 21, including determining whether the attenuator has left the predetermined range, and terminating the oscillation of said pulsed light source in response to a determination that the attenuator has left the predetermined range.

23. A method according to claim 21, including exposing a photosensitive substrate with a pattern of the illuminated object.

* * * * *

UNITED STATES PATENT AND TRADEMARK OFFICE
CERTIFICATE OF CORRECTION

PATENT NO. : 6,011,612
DATED : January 4, 2000
INVENTOR(S) : Go et al.

It is certified that error appears in the above-identified patent and that said Letters Patent is hereby corrected as shown below:

<u>Title page,</u>
Item [*] Notice: This patent issued on a continued prosecution application filed under 37 CFR 1.53(d), and is subject to the twenty year patent term provisions of 35 U.S.C. 154(a)(2) should be deleted.

Signed and Sealed this

Twenty-fifth Day of December, 2001

Attest:

Attesting Officer

JAMES E. ROGAN
Director of the United States Patent and Trademark Office